United States Patent
Cameron et al.

(10) Patent No.: US 6,783,912 B2
(45) Date of Patent: Aug. 31, 2004

(54) PHOTOACID GENERATORS AND PHOTORESISTS COMPRISING SAME

(75) Inventors: James F. Cameron, Cambridge, MA (US); Gerhard Pohlers, Newton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 53 days.

(21) Appl. No.: 09/795,661

(22) Filed: Feb. 27, 2001

(65) Prior Publication Data

US 2002/0009663 A1 Jan. 24, 2002

Related U.S. Application Data

(60) Provisional application No. 60/185,717, filed on Feb. 27, 2000.

(51) Int. Cl.$^7$ .......................... G03F 7/004; G03F 7/039
(52) U.S. Cl. .................. 430/170; 430/270.1; 430/905; 430/910
(58) Field of Search ................... 430/170, 270.1, 430/905, 910

(56) References Cited

U.S. PATENT DOCUMENTS

| | | | | |
|---|---|---|---|---|
| 4,980,508 A | * | 12/1990 | Bartmann | 568/22 |
| 5,338,641 A | * | 8/1994 | Pawlowski et al. | 430/165 |
| 5,350,660 A | * | 9/1994 | Urano et al. | 430/176 |
| 5,585,220 A | | 12/1996 | Breyta et al. | |
| 5,945,517 A | | 8/1999 | Nitta et al. | |

FOREIGN PATENT DOCUMENTS

| | | |
|---|---|---|
| EP | 0 440 375 A1 | 8/1991 |
| EP | 0 789 279 A | 8/1997 |
| EP | 0 908 783 A1 | 4/1999 |
| EP | 0 915 382 A2 | 5/1999 |
| JP | 02 106751 A | 4/1990 |
| JP | 11 249292 A | 9/1999 |

\* cited by examiner

*Primary Examiner*—John S. Chu
(74) *Attorney, Agent, or Firm*—Peter F. Corless; Darryl P. Frickey; Edwards & Angell, LLP

(57) ABSTRACT

New photoacid generator compounds ("PAGs") are provided and photoresist compositions that comprise such compounds. In particular, non-ionic substituted disulfone compounds PAGS are provided, including disulfone PAGs that contain a diazo, substituted methylene or hydrazine moiety interposed between substituted sulfone groups. Also provided are positive- and negative-acting chemically amplified resists that contain such PAGs and that are preferably imaged with sub-300 nm or sub-200 nm radiation such as 248 nm, 193 nm, or 157 nm radiation.

22 Claims, No Drawings

PHOTOACID GENERATORS AND PHOTORESISTS COMPRISING SAME

This application claims the benefit of U.S. Provisional Application(s) No.(s).: 60/185,717 filing date Feb. 27, 2000.

BACKGROUND OF THE INVENTION

1. Field of the Invention

This invention relates to new photoacid generator compounds ("PAGs") and photoresist compositions that comprise such compounds. In particular, the invention relates to substituted disulfone compounds, including disulfone compounds that contain a diazo, substituted methylene or hydrazine moiety interposed between two substituted sulfone groups.

2. Background

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define an image desired to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

Known photoresists can provide features having resolution and size sufficient for many existing commercial applications. However for many other applications, the need exists for new photoresists that can provide highly resolved images of submicron dimension.

Various attempts have been made to alter the make-up of photoresist compositions to improve performance of functional properties. Among other things, a variety of photoactive compounds have been reported for use in photoresist compositions. See, e.g., U.S. Pat. No. 4,450,360 and European Application 615163.

More recently, certain "chemically amplified" photoresist compositions have been reported. Such photoresists may be negative-acting or positive-acting and rely on multiple crosslinking events (in the case of a negative-acting resist) or deprotection reactions (in the case of a positive-acting resist) per unit of photogenerated acid. In other words, the photogenerated acid acts catalytically. In the case of positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,851; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl, phenol or imide, which results in different solubility characteristics in exposed and unexposed areas of the resist coating layer.

SUMMARY OF THE INVENTION

We have now discovered novel photoacid generator compounds (PAGs) for use in either positive-acting or negative-acting photoresist compositions. PAGs of the invention contain a disulfone groups, including disulfone compounds that contain a diazo, substituted methylene or hydrazine moiety interposed between two substituted sulfone groups.

More particularly, in a first aspect of the invention, substituted diazodisulfone PAGs are provided that comprise one or more substituents of: phenyl having one or more electron-withdrawing ring substituents; an optionally substituted alicyclic group, particularly polycyclic groups having 2, 3, 4 or more fused, bridged or otherwise linked rings such as adamantyl, pinanyl, fencyl, tricyclodecane, and the like; optionally substituted naphthyl; optionally substituted thienyl; optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl.

Particularly preferred substituted diazodisulfone PAGs of the invention include those of the following Formula I:

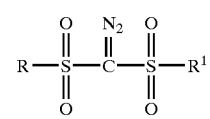

I wherein R and $R^1$ at least one of R and $R^1$ is phenyl having one more phenyl-ring electron-withdrawing substituents; an optionally substituted alicyclic group; optionally substituted naphthyl; optionally substituted thienyl; optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl. Formula I is further discussed below.

In a further aspect of the invention, substituted α,α-methylenedisulfone PAGs are provided, wherein preferably the methylene (e.g. $C(R^2)(R^3)$ as $R^2$ and $R^3$ are shown in Formula II below) interposed between the two sulfone moieties is mono- or di-substituted with non-hydrogen substituents.

Preferred substituted α,α-methylenedisulfone PAGs of the invention include those of the following Formula II:

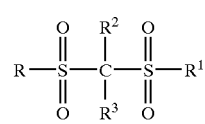

II wherein R and $R^1$ are the same or different and are other than hydrogen;

$R^2$ and $R^3$ are the same or different and may be hydrogen or a non-hydrogen substituent;

and preferably at least one of $R^2$ and $R^3$ is other than hydrogen, more preferably both $R^2$ and $R^3$ are other than hydrogen. Formula II is further discussed below.

In a still further aspect of the invention, substituted disulfonehydrazine (hydrazine moiety interposed between the two sulfone moieties) PAGs are provided, wherein preferably the hydrazine moiety (e.g. —$N(R^2)$—$N(^3)$— of Formula III below) interposed between the two sulfone moieties is mono- or di-substituted with non-hydrogen substituents.

Preferred substituted disulfonehydrazine PAGs of the invention include those of the following Formula III:

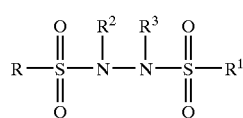

wherein R and $R^1$ are the same or different and are other than hydrogen;

$R^2$ and $R^3$ are the same or different and may be hydrogen or a non-hydrogen substituent;

and preferably at least one of $R^2$ and $R^3$ is hydrogen, more preferably both $R^2$ and $R^3$ are hydrogen. Formula III is further discussed below.

Preferred compounds of the invention also disulfone compounds, where no carbons or other atoms are interposed between the sulfone groups. Preferred disulfone compounds include both unsymmetrical and symmetrical PAGs of the following Formulae IVA and IVB:

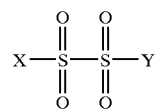

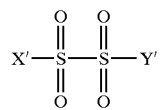

wherein in Formula IVA, X and Y are different and are selected from the group consisting of optionally substituted naphthyl including optionally substituted 1-naphthyl and optionally substituted 2-naphthyl; pentafluorophenyl; optionally substituted thienyl (including optionally substituted 2-thienyl); perfluoroalkyl particularly perfluoro$C_{1-12}$alkyl or perfluoro$C_{1-8}$alkyl such as $CF_3$ and the like; 2,2,2-trifluoroethyl; optionally substituted o-(trifluoromethyl)phenyl; optionally substituted adamantyl (particularly 1-adamantyl); optionally substituted camphoryl (particularly 10-camphoryl); optionally substituted cyclohexyl; and optionally substituted t-butyl, with the exclusion where X is camphoryl and Y is naphthyl; and wherein in Formula IVB, X' and Y' are the same and are selected from perfluoroalkyl particularly perfluoro$C_{1-12}$alkyl or perfluoro$C_{1-8}$alkyl such as $CF_3$ and the like; optionally substituted camphoryl (particularly 10-camphoryl); optionally substituted o-(trifluoromethyl)phenyl; optionally substituted thienyl including optionally substituted 2-thienyl; optionally substituted adamantyl) (particularly (1-adamantyl); and optionally substituted t-butyl.

Preferably, PAGs of the invention are used in positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Preferred imaging wavelengths include sub-300 nm wavelengths e.g. 248 nm, and sub-200 nm wavelengths e.g. 193 nm and sub-170 nm such as 157 nm.

The invention also provide methods for forming relief images of the photoresists of the invention, including methods for forming highly resolved patterned photoresist images (e.g. a patterned line having essentially vertical sidewalls) of sub-micron and even sub-half or sub-quarter micron dimensions.

The invention further provides articles of manufacture comprising substrates such as a microelectronic wafer or a flat panel display substrate having coated thereon the photoresists and relief images of the invention. Other aspects of the invention are disclosed infra.

DETAILED DESCRIPTION OF THE INVENTION

As discussed above, preferred substituted diazodisulfone PAGs of the invention include those of the following Formula I:

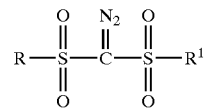

wherein R and $R^1$ are each independently optionally substituted alkyl, preferably having 1 to about 20 carbons, more preferably 1 to about 12 carbons; optionally substituted alkoxy, preferably having 1 to about 20 carbons, more preferably 1 to about 12 carbons; optionally substituted alkylthio, preferably having 1 to about 20 carbons, more preferably 1 to about 12 carbons; optionally substituted carbocyclic aryl such as phenyl, naphthyl, acenaphthyl and the like; optionally substituted aralkyl preferably having 7 to about 18 carbons such as benzyl; optionally substituted heteroaryl or heteroalicyclic having from 1 to 3 rings, 3 to 8 ring members in each ring and from 1 to 3 hetero atoms; phenyl having one more phenyl-ring electron-withdrawing substituents; an optionally substituted alicyclic group; optionally substituted naphthyl; optionally substituted thienyl; optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl;

wherein at least one of R and $R^1$ is phenyl having one more phenyl-ring electron-withdrawing substituents; an optionally substituted alicyclic group; optionally substituted naphthyl; optionally substituted thienyl; optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl.

Preferred phenyl R and/or $R^1$ substituents of PAGs of Formula I comprise one or more ring substituents of halo (F, Cl, Br, or I); nitro; cyano; sulfono; alkanoyl; and other alkyl substituted with one or more electron-withdrawing substituents such as nitro, cyano, sulfono, alkanoyl, and halo (i.e. haloalkyl) e.g. trifluoromethyl, perhaloalkyl such as perfluoro$C_{1-4}$alkyl; and the like.

Preferred substituted α,α-methylenedisulfone PAGs of the invention include those of the following Formula II:

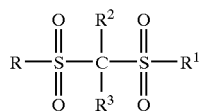

II wherein R and $R^1$ are the same or different non-hydrogen substituents such as optionally substituted alkyl, preferably having 1 to about 20 carbons, more preferably 1 to about 12 carbons; optionally substituted alkoxy, preferably having 1 to about 20 carbons, more preferably 1 to about 12 carbons; optionally substituted alkylthio, preferably having 1 to about 20 carbons, more preferably 1 to about 12 carbons; optionally substituted alkylsulfinyl, preferably having 1 to about 20 carbons, more preferably 1 to about 12 carbons; optionally substituted alkylsulfonyl, preferably having 1 to about 20 carbons, more preferably 1 to about 12 carbons; optionally substituted carbocyclic aryl such as phenyl, naphthyl, acenaphthyl and the like; optionally substituted aralkyl preferably having 7 to about 18 carbons such as benzyl; optionally substituted heteroaryl or heteroalicyclic having from 1 to 3 rings, 3 to 8 ring members in each ring and from 1 to 3 hetero atoms; or an optionally substituted alicyclic group, preferably having 8 to about 20 carbon such as adamantyl, pinanyl, fencyl, tricyclodecane;

$R^2$ and $R^3$ are the same or different and may be hydrogen or a non-hydrogen substituent such as optionally substituted alkyl preferably having 1 to about 20 carbons, more preferably 1 to about 12 carbons; optionally substituted alkoxy preferably having 1 to about 20 carbons, more preferably 1 to about 12 carbons; optionally substituted alkylthio preferably having 1 to about 20 carbons, more preferably 1 to about 12 carbons; optionally substituted alkylsulfinyl preferably having 1 to about 20 carbons, more preferably 1 to about 12 carbons; optionally substituted alkylsulfonyl preferably having 1 to about 20 carbons, more preferably 1 to about 12 carbons; optionally substituted carbocyclic aryl such as phenyl, naphthyl, acenaphthyl and the like; optionally substituted aralkyl preferably having 7 to about 18 carbons such as benzyl; optionally substituted heteroaryl or heteroalicyclic having from 1 to 3 rings, 3 to 8 ring members in each ring and from 1 to 3 hetero atoms; or an optionally substituted alicyclic group, preferably having 8 to about 20 carbon such as adamantyl, pinanyl, fencyl, tricyclodecane;

and preferably at least one of $R^2$ and $R^3$ is other than hydrogen, more preferably both $R^2$ and $R^3$ are other than hydrogen.

Preferred substituted disulfonehydrazine PAGs of the invention include those of the following Formula III:

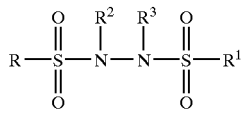

III wherein R and $R^1$ are the same or different and are other than hydrogen such as optionally substituted alkyl, preferably having 1 to about 20 carbons, more preferably 1 to about 12 carbons; optionally substituted alkoxy, preferably having 1 to about 20 carbons, more preferably 1 to about 12 carbons; optionally substituted alkylthio, preferably having 1 to about 20 carbons, more preferably 1 to about 12 carbons; optionally substituted alkylsulfinyl, preferably having 1 to about 20 carbons, more preferably 1 to about 12 carbons; optionally substituted alkylsulfonyl, preferably having 1 to about 20 carbons, more preferably 1 to about 12 carbons; optionally substituted carbocyclic aryl; optionally substituted aralkyl preferably having 7 to about 18 carbons such as benzyl; optionally substituted heteroaryl; optionally substituted heteroalicyclic; or an optionally substituted alicyclic group;

$R^2$ and $R^3$ are the same or different and may be hydrogen or a non-hydrogen substituent such as optionally substituted alkyl, preferably having 1 to about 20 carbons, more preferably 1 to about 12 carbons; optionally substituted alkoxy, preferably having 1 to about 20 carbons, more preferably 1 to about 12 carbons; optionally substituted alkylthio, preferably having 1 to about 20 carbons, more preferably 1 to about 12 carbons; optionally substituted alkylsulfinyl, preferably having 1 to about 20 carbons, more preferably 1 to about 12 carbons; optionally substituted alkylsulfonyl , preferably having 1 to about 20 carbons, more preferably 1 to about 12 carbons 1; optionally substituted carbocyclic aryl such as phenyl, naphthyl, acenaphthyl and the like; optionally substituted aralkyl preferably having 7 to about 18 carbons such as benzyl; optionally substituted heteroaryl or heteroalicyclic having from 1 to 3 rings, 3 to 8 ring members in each ring and from 1 to 3 hetero atoms; or an optionally substituted alicyclic group, preferably having 8 to about 20 carbon such as adamantyl, pinanyl, fencyl, tricyclodecane;

and preferably at least one of $R^2$ and $R^3$ is hydrogen, more preferably both $R^2$ and $R^3$ are hydrogen.

Preferred compounds of the invention also disulfone compounds, where no carbons or other atoms are interposed between the sulfone groups. Preferred disulfone compounds include both unsymmetrical and symmetrical PAGs of the following Formulae IVA and IVB:

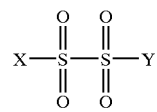

IVA wherein in Formula IVA, X and Y are different and are selected from the group consisting of optionally substituted naphthyl including optionally substituted 1-naphthyl and optionally substituted 2-naphthyl; pentafluorophenyl; 2,2,2-trifluoroethyl; optionally substituted thienyl (including optionally substituted 2-thienyl); perfluoroalkyl particularly perfluoro$C_{1-12}$alkyl or perfluoro$C_{1-8}$alkyl such as $CF_3$ and the like; optionally substituted o-(trifluoromethyl)phenyl; optionally substituted adamantyl (particularly 1-adamantyl); optionally substituted camphoryl (particularly 10-camphoryl); optionally substituted cyclohexyl; and optionally substituted t-butyl, with the exclusion where X is camphoryl and Y is naphthyl;

Additional preferred disulfone PAGs include those of the following Formula IVB:

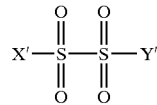

IVB wherein in Formula IVB, X' and Y' are the same and are selected from perfluoroalkyl particularly perfluoro$C_{1-12}$alkyl or perfluoro$C_{1-8}$alkyl such as $CF_3$ and the like; 2,2,2- trifluoroethyl; optionally substituted camphoryl (particularly 10-camphoryl); optionally substituted o-(trifluoromethyl) phenyl; optionally substituted thienyl including optionally substituted 2-thienyl; optionally substituted adamantyl (particularly (1-adamantyl); and optionally substituted t-butyl.

Particularly preferred photoresists of the invention contain an imaging-effective amount of one or more PAGs of the invention (including one or more PAGs of the above Formulae I, I, III, IVA and/or IVB) that is selected from the group of:

1) a phenolic resin that contains acid-labile groups that can provide a chemically amplified positive resist particularly suitable for imaging at 248 nm. Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photo-induced reaction; such polymers have been described in U.S. Pat. Nos. 6,042,997 and 5,492,792, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers I) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups, such as polymers described in U.S. Pat. Nos. 5,929,176 and 6,090,526, incorporated herein by reference;

2) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624 and 6,048,664, incorporated herein by reference; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates, such polymers have been described in U.S. Pat. No. 6,057,083, European Published Applications EP01008913A1 and EP00930542A1, and U.S. Pat. No. 6,136,501, all incorporated herein by reference; and iii) polymers that contain maleic anhydride units.

As stated above, various substituent groups of PAGs of the invention may be optionally substituted. Substituted moieties (including substituted R and $R^1$ groups of Formula I; substituted R, $R^1$, $R^2$ and $R^3$ groups of Formula II; substituted R, $R^1$, $R^2$ and $R^3$ groups of Formula III; and substituted X, Y, X' and Y' groups of Formula IVA and IVB,) are suitably substituted at one or more available positions by, e.g., halogen such as F, Cl Br and/or I, nitro, cyano, sulfono, alkyl including $C_{1-16}$ alkyl with $C_{1-8}$ alkyl being preferred, haloalkyl such as fluoroalkyl (e.g. trifluoromethyl) and perhaloalkyl such as perfluoro$C_{1-4}$alkyl, alkoxy including $C_{1-16}$ alkoxy having one or more oxygen linkages with $C_{1-8}$ alkoxy being preferred, alkenyl including $C_{2-12}$ alkenyl with $C_{2-8}$ alkenyl being preferred, alkenyl including $C_{2-12}$ alkenyl with $C_{2-8}$ alkynyl being preferred, aryl such as phenyl or naphthyl and substituted aryl such as halo, alkoxy, alkenyl, alkynyl and/or alkyl substituted aryl, preferably having the number of carbon atoms mentioned above for corresponding groups. Preferred substituted aryl groups include substituted phenyl, anthracenyl and naphthyl.

As used herein, the term alkyl, alkenyl and alkynyl unless otherwise modified refers to both cyclic and noncyclic groups, although of course cyclic groups will comprise at least three carbon ring members. Alkenyl and alkynyl groups of compounds of the invention have one or more unsaturated linkages, typically 1 to about 3 or 4 unsaturated linkages. Also, the terms alkenyl and alkynyl as used herein refer to both cyclic and noncyclic groups, although straight or branched noncyclic groups are generally more preferred. Alkoxy groups of PAG compounds of the invention have one or more oxygen linkages, typically 1 to about 5 or 6 oxygen linkages. Alkylthio groups of compounds of the invention have one or more thioether linkages, typically 1 to about 5 or 6 thioether linkages. Alkylsulfinyl groups of PAG compounds of the invention have one or more sulfinyl (SO) linkages, typically 1 to about 5 or 6 sulfinyl linkages. Alkylsulfonyl groups of PAG compounds of the invention have one or more sulfonyl ($SO_2$) linkages, typically 1 to about 5 or 6 sulfonyl linkages. Preferred alkylamino groups of PAG compounds of the invention include those groups having one or more primary, secondary and/or tertiary amine groups, preferably 1 to about 3 or 4 amine groups. Suitable alkanoyl groups have one or more carbonyl groups, typically 1 to about 4 or 5 carbonyl groups. Alkoxy, alkylthio, alkylsulfinyl, alkylsulfonyl, alkanoyl and other groups may be suitably either linear or branched. Carbocyclic aryl as used herein refers to non-hetero aromatic groups that have 1 to 3 separate or fused rings and 6 to about 18 carbon ring members and may include e.g. phenyl, naphthyl, biphenyl, acenaphthyl, phenanthracyl, and the like. Phenyl and naphthyl are often preferred. Suitable heteroaromatic or heteroaryl groups will have 1 to 3 rings, 3 to 8 ring members in each ring and from 1 to about 3 hetero atoms (N, O or S). Specifically suitable heteroaromatic or heteroaryl groups include e.g. courmarinyl, quinolinyl, pyridyl, pyrazinyl, pyrimdinyl, furyl, pyrrolyl, thienyl, thiazolyl, oxazolyl, imidazolyl, indolyl, benzofuranyl, and benzothiazole.

PAGs of the invention can be readily prepared. For instance, PAGs of Formula I can be prepared as generally outlined in the examples below, which includes reaction of a substituted sulfone with potassium bis(trimethylsilyl) amide and another sulfone reagent to a di-sulfone intermediate with is then treated with an azide to provide the desired diazo-disulfone compound. PAGs of Formula II can be prepared in similar manner, but without the azide reaction step. To provide PAGs of Formula II where the methylene interposed between the sulfone group is other than hydrogen, the methylene intermediate can be treated with a suitable base such as a hydride (e.g. NaH) and then further reacted for instance a suitable alkylating or aryl reagent such as methyl iodide and the like. To provide hydrazine PAGs of Formula III, hydrazine can be reacted with a molar equivalent of a first substituted reactive sulfone (e.g. a substituted sulfonyl chloride) and then with a further molar equivalent of a second substituted reactive sulfone, where the first and second substituted sulfones may be the same or different.

As discussed above, PAGs of the invention are useful as the radiation sensitive component in photoresist compositions, including both positive-acting and negative-acting chemically amplified resist compositions.

The photoresists of the invention typically comprise a resin binder and a photoactive component of the invention as described above. Preferably the resin binder has functional groups that impart alkaline aqueous developability to the resist composition. For example, preferred are resin binders that comprise polar functional groups such as hydroxyl or carboxylate. Preferably the resin binder is used in a resist composition in an amount sufficient to render the resist developable with an aqueous alkaline solution. For example, preferred resin binders are phenolic resins including phenol aldehyde condensates known in the art as novolak resins, homo and copolymers of alkenyl phenols and homo and copolymers of N-hydroxyphenyl-maleimides.

Examples of suitable phenols for condensation with a aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

Other particularly preferred resins for use with a photoacid generator of the invention include those discussed above, such as the phenolic/acrylate copolymers and terpolymers and the resin substantially free (i.e. less than 5, 4, 3, 2 0r 1 mole percent based on total polymer units) of aromatic units.

Preferably, a photoacid generator compound of the invention is employed in a chemically amplified positive-acting resist. A number of such resist compositions have been described, e.g. in U.S. Pat. Nos. 4,968,581; 4,883,740; 4,810,613 and 4,491,628 and Canadian Patent Application 2,001,384, all of which are incorporated herein by reference for their teaching of making and using chemically amplified positive-acting resists. In accordance with the present invention, those prior resist compositions are modified by substitution of the photoactive component of the invention as the radiation sensitive component.

A particularly preferred chemically amplified photoresist of the invention comprises in admixture a photoactive component of the invention and a resin binder that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

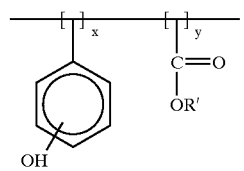

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Another preferred resin binder for a positive chemically amplified resist of the invention has phenolic and nonaromatic cyclic alcohol units, wherein at least of portion of the hydroxyl groups of the copolymer are bonded to acid labile groups. Preferred acid labile moieties are acetate groups including t-butyl acetate groups of the formula $(CH_3)_3COC(O)CH_2$—; oxycarbonyl groups such as t-butyl oxycarbonyl (t-Boc) groups of the formula $(CH_3)_3CC(O)O$—; and acetal and ketals. Chemically amplified positive-acting photoresists containing such a copolymer have been disclosed in U.S. Pat. No. 5,258,257 to Sinta et al.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

PAGs of the invention (which includes PAGs of Formulae I, II, III, IVA and IVB as defined above) also are preferably used with polymers that contain one or more photoacid-labile groups and that are substantially, essentially or completely free of phenyl or other aromatic groups. Such photoresist compositions are particularly useful for imaging with sub-200 nm radiation such as 193 nm radiation.

For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 of the Shipley Company.

Preferred negative-acting compositions of the invention comprise a mixture of materials that will cure, crosslink or harden upon exposure to acid, and a photoactive component of the invention.

Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, particularly tetrabutylammonium hydroxide (TBAH), which can enhance resolution of a developed resist relief image. The added base is suitably used in relatively small amounts, e.g. about 1 to 10 percent by weight relative to the PAC, more typically 1 to about 5 weight percent. Other preferred basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin binder component of resists of the invention are typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The photoresists of the invention are generally prepared following known procedures with the exception that a PAG of the invention is substituted for prior photoactive compounds used in the formulation of such photoresists. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; lactates such as ethyl lactate or methyl lactate, with ethyl lactate being preferred; proponiates, particularly methyl propionate and ethyl propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition.

The photoresists of the invention can be used in accordance with known procedures. Though the photoresists of the invention may be applied as a dry film, they are preferably applied on a substrate as a liquid coating composition, dried by heating to remove solvent preferably until the coating layer is tack free, exposed through a photomask to activating radiation, optionally post-exposure baked to create or enhance solubility differences between exposed and nonexposed regions of the resist coating layer, and then developed preferably with an aqueous alkaline developer to form a relief image.

The substrate on which a resist of the invention is applied and processed suitably can be any substrate used in processes involving photoresists such as a microelectronic wafer. For example, the substrate can be a silicon, silicon dioxide or aluminum-aluminum oxide microelectronic wafer. Gallium arsenide, ceramic, quartz or copper substrates may also be employed. Printed circuit board substrates such as copper clad laminates are also particularly preferred. The photoresists of the invention will be particularly useful for circuit board imaging, including through hole and other aperture plating. Typical printed circuit board substrates have one or more copper layers interleaved with resin layers, such as epoxy layers.

Substrates used for liquid crystal display and other flat panel display applications are also suitably employed, e.g. glass substrates, indium tin oxide coated substrates and the like.

A liquid coating resist composition may be applied by any standard means such as spinning, dipping or roller coating. Photoresists of the invention also may be formulated and applied as dry film resists, particularly for printed circuit board manufacture applications. The exposure energy should be sufficient to effectively activate the photoactive component of the radiation sensitive system to produce a patterned image in the resist coating layer. Suitable exposure energies typically range from about 1 to 300 mJ/cm$^2$. As discussed above, preferred exposure wavelengths include sub-300 nm such as 248 nm, and sub-200 nm such as 193 nm and 157 nm. Suitable post-exposure bake temperatures are from about 50° C. or greater, more specifically from about 50 to 140° C. For an acid-hardening negative-acting resist, a post-development bake may be employed if desired at temperatures of from about 100 to 150° C. for several minutes or longer to further cure the relief image formed upon development. After development and any post-development cure, the substrate surface bared by development may then be selectively processed, for example chemically etching or plating substrate areas bared of photoresist in accordance with procedures known in the art. Suitable etchants include a hydrofluoric acid etching solution and a plasma gas etch such as an oxygen plasma etch.

All documents mentioned herein are incorporated herein by reference. The following non-limiting examples are illustrative of the invention.

EXAMPLES 1–2

PAG Syntheses

Example 1

Preparation of p-toluenesulfonyl-trifluoromethanesulfonyl-diazomethane

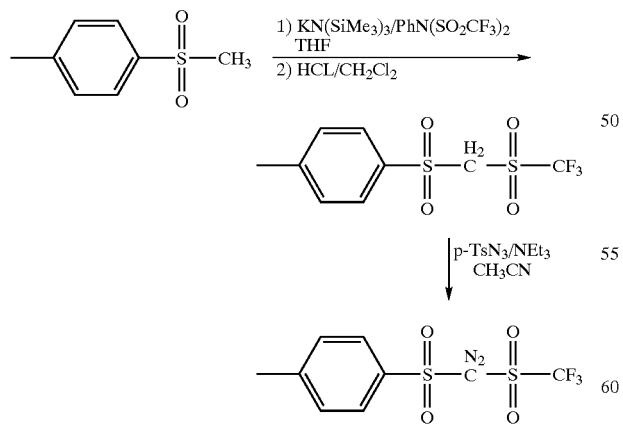

Under a nitrogen atmosphere potassium bis(trimethylsilyl)-amide (20.99 g, 0.105 mole) is dissolved in 180 ml dry THF and the solution cooled to 0–5° C. in an ice bath. To this solution p-tolyl methyl sulfone (8.51 g, 0.05 mole) is added in one portion and the mixture stirred for 25 min. At that temperature, N-phenyltrifluoromethanesulfonimide (17.84 g, 0.05 mole) is added in one portion. The ice bath is removed and the mixture refluxed for 2.5 h, cooled to room temperature, filtered and rinsed with 50 ml ether once. After drying in vacuum, 14.73 g (86.5%) of the corresponding potassium salt are obtained as a white solid.

To a suspension of the salt in 200 ml dichloromethane is added 20 ml conc. HCl and the mixture is then stirred for 18 h, the phases are separated and the aqueous phase extracted with dichloromethane (130 ml) once. The combined organic phases are dried over MgSO$_4$, the solvent removed and the residue dried under vacuum, leaving p-toluenesulfonyl-trifluoromethanesulfonyl-methane as a white solid (12.9 g, 99%).

Crude p-toluenesulfonyl-trifluoromethanesulfonyl-methane (5 g, 0.017 mole) is dissolved in acetonitrile (200 ml) under nitrogen and the solution is cooled to 0° C. using an ice bath. Tosyl azide (16.3 g, 0.083 mole) and then triethylamine (4.6 ml, 0.063 mole) are added in one portion and the reaction mixture is stirred at that temperature for 24 h. After adding water (1l), the mixture is extracted twice with dichloromethane (300 ml) and the combined organic phases are washed with 1 N HCl, saturated sodium bicarbonate and water. After drying over MgSO$_4$ and removal of the solvent, the resulting yellow orange oil was chromatographed on silica gel using ethyl acetate/cyclohexane 1:5 as eluent, yielding p-toluenesulfonyl-trifluoromethanesulfonyl-diazomethane as a yellowish solid. The structure was confirmed by $^1$H/$^{13}$C NMR and IR spectroscopy.

Example 2

Preparation of bis(1-adamantylbenzenesulfonyl) diazomethane

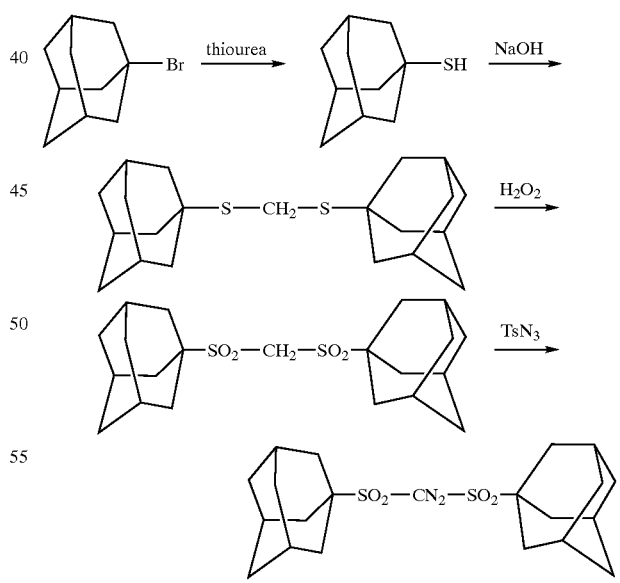

Preparation of Thiol from Bromide

In a 1L flask, 1-bromoadamantane (32.25 g, 0.15 mol), thiourea (22.8 g, 0.3 mol) and acetic acid (150 ml) were mixed and the reaction was heated at 90° C. for 5 hrs. During this time, all the solids dissolved to form a homogeneous solution. The reaction was left to cool down to room temperature and a lot of white precipitates formed again. Filtration gave ~50 g white solid. The solid was stirred with 5% aqueous/ethanol NaOH solution (370 ml, water:ethanol= 300:70) for overnight. The reaction was acidified to pH=5 with concentrated HCl and a lot of white solid was formed. Ether/Benzene (1:1) 200 ml was added and the reaction was filtered. The reaction was extracted with ether/benzene (1:1) (150×6). The combined organic layer was dried over MgSO4. Filtration and evaporation gave 12 g white solid (0.071 mol, 48% yield). $^1$H and $^{13}$C NMR were confirmed the structure. Ref: Khullar K. K. and Bauer L., *J Org. Chem.*, 36:3038 (1971).

Thiol Coupling Reaction and Oxidation Reaction:

To the above made thiol (12 g, 0.071 mol) in 50 ml EtOH in a 250 ml 3-neck flask, KOH (5.86 g, 0.08 mol) in 50 ml EtOH was added slowly. Methylene chloride (4.5 g, 0.053 mol) was added in one portion and the reaction was refluxed at 50° C. overnight.

After reacting overnight, the reaction was cooled down to 0° C. in an ice-bath. Another 75 ml of EtOH was added followed by NaWO$_4$.2H$_2$O (1.56 g, 0.0047 mol) in one portion. 15 min later, H$_2$O$_2$ (72.5 ml, 0.71 mol) was added dropwise via an addition funnel. The addition time was 45 min at this scale. Initial addition was exothermic and the temperature was kept below 12° C. during the whole process. 10 min after addition, the ice-bath was taken away and the reaction was stirred at room temperature for 45 min before it was heated at 50° C. for 16 hours (overnight). After reacting overnight, $^1$H NMR detected the presence of both sulfone and sulfone-sulfoxide. The reaction was cooled down to RT and 33 g mCPBA (0.11 mol) was added in five portions, with 10 min between each addition. The reaction was left to stir at RT overnight. Filtration gave the product as a white solid. The solid was refluxed in 300 ml ethanol for 10 min and then it was cooled down to room temperature and stored in fridge overnight. Filtration gave some white solids (5.61 g, 23 mmol, 85% yield). The structure was confirmed by $^1$H and $^{13}$C NMR.

Diazo-transfer Reaction:

In a 1L 3-neck flask, NaOH (344 mg, 8.3 mmol) and bissulfone (3.13 g, 7.6 mmol) were dissolved in 500 ml acetonitrile/H$_2$O (7:3) to form a homogeneous solution. The reaction was cooled down in an ice-bath and tosyl azide (1.51 g, 7.6 mmol) was added. After addition the reaction was left to stir at room temperature for an hour before 150 ml acetonitrile was evaporated. The reaction was stored in fridge overnight. Filtration gave some white solid (0.75 g). Repeating the condensation/crystallization a few more times gave more product. The estimated yield for this step is 60%. The structure is confirmed by $^1$H and $^{13}$C NMR and IR.

Example 3

Preparation of 2-thienylsulfonyl-trifluoromethanesulfonyl-diazomethane

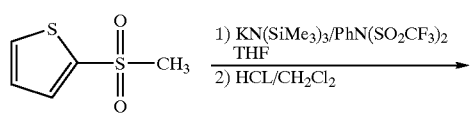

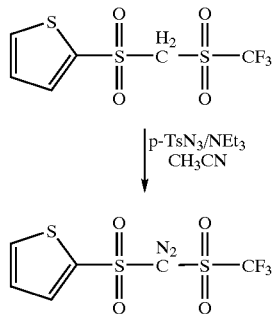

Under a nitrogen atmosphere potassium bis(trimethylsilyl)-amide (10.92 g, 0.052 mole) is dissolved in 100 ml dry THF and the solution cooled to 0–5° C. in an ice bath. To this solution 2-thienyl methyl sulfone (5 g, 0.03 mole) is added in one portion and the mixture is stirred for 25 min. At that temperature, N-phenyltrifluoromethanesulfonimide (9.08 g 0.025 mole) is added in one portion. The ice bath is removed and the mixture refluxed for 2 h, cooled to room temperature, filtered and rinsed with 50 ml ether once. After drying in vacuum, 6.4 g (77%) of the corresponding potassium salt are obtained as a white solid. To a suspension of the salt in 130 ml dichloromethane is added 9 ml conc. HCl and the mixture is then stirred for 21 h, the phases are separated and the aqueous phase extracted with dichloromethane once. The combined organic phases are dried over MgSO$_4$, the solvent removed and the residue dried under vacuum, leaving 2-thienylsulfonyl-trifluoromethanesulfonyl-methane as a white solid (5.6 g, 990%).

Crude 2-thienylsulfonyl-trifluoromethanesulfonyl-methane (5.6 g, 0.019 mole) is dissolved in acetonitrile (250 ml) under nitrogen and the solution is cooled to 0° C. using an ice bath. Tosyl azide (18.76 g, 0.095 mole) and then triethylamine (5.3 ml, 0.038 mole) are added in one portion and the reaction mixture is stirred at that temperature for 24 h. After adding water (450 ml) and dichloromethane (200 ml), the phases are separated and the aqueous layer is extracted twice with dichloromethane (150 ml) and the combined organic phases are washed with 1 N HCl, saturated sodium bicarbonate and water. After drying over MgSO4 and removal of the solvent, the crude product is obtained as orange oil, which was chromatographed on silica gel using ethyl acetate/cyclohexane 1:4 as eluent, yielding 2-thienyl-trifluoromethanesulfonyl-diazomethane as a yellowish solid (400 mg, 6.5%). The structure was confirmed by $^1$H/$^{13}$C NMR and IR spectroscopy.

Example 4

Preparation of 2-naphthalenesulfonyl-trifluoro methanesulfonyl-diazomethane

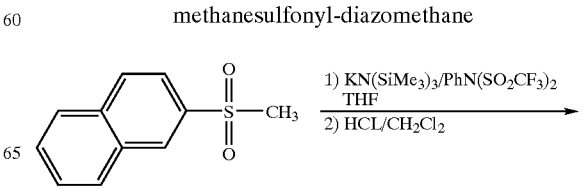

-continued

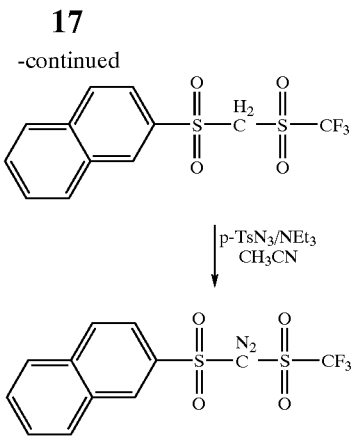

Under a nitrogen atmosphere potassium bis(trimethylsilyl)-amide (20.99 g, 0.105 mole) is dissolved in 180 ml dry THF and the solution cooled to 0–5° C. in an ice bath. To this solution 2-naphthyl methyl sulfone (10.4 g, 0.05 mole) is added in one portion and the mixture is stirred for 25 min. At that temperature, N-phenyltrifluoromethanesulfonimide (17.84 g, 0.05 mole) is added in one portion. The ice bath is removed and the mixture refluxed for 2.5 h, cooled to room temperature, filtered and rinsed with 50 ml ether once. After drying in vacuum, 16.7 g (92%) of the corresponding potassium salt are obtained as a white solid. To a suspension of the salt in 200 ml dichloromethane is added 20 ml conc. HCl and the mixture is then stirred for 18 h, the phases are separated and the aqueous phase extracted with dichloromethane (130 ml) once. The combined organic phases are dried over MgSO4, the solvent removed and the residue dried under vacuum, leaving 2-naphthalenesulfonyl-trifluoromethanesulfonyl-methane as a white solid (12.8 g, 86%).

Crude 2-naphthalenesulfonyl-trifluoromethanesulfonyl-methane (5 g, 0.014 mole) is dissolved in acetonitrile (150 ml) under nitrogen and the solution is cooled to 0° C. using an ice bath. Tosyl azide (8.3 g, 0.042 mole) and then triethylamine (3.9 ml, 0.028 mole) are added in one portion and the reaction mixture is stirred at that temperature for 24 h. After adding water (400 ml) and dichloromethane (200 ml), the phases are separated and the aqueous layer is extracted twice with dichloromethane (150 ml) and the combined organic phases are washed with 1 N HCl, saturated sodium bicarbonate and water. After drying over MgSO$_4$ and removal of the solvent, the crude product is obtained as orange oil.

Example 5

Photoresist Preparation and Lithographic Processing

A photoresist of the invention is prepared by mixing the following components with amounts expressed as weight percent based on total weight of the resist compositions:

| Resist components | Amount (wt. %) |
| --- | --- |
| Resin binder | 15 |
| Photoacid generator | 4 |
| Ethyl lactate | 81 |

The resin binder is a terpolymer consisting of polymerized 60 mole percent vinylphenol units, 20 mole percent styrene units and 20 mole percent t-butylacrylate. The photoacid generator is p-toluenesulfonyl-trifluoromethanesulfonyl-diazomethane of Example 1 above. Those resin and PAG components are admixed in the ethyl lactate solvent.

The formulated resist composition is spin coated onto HMDS vapor primed 4 inch silicon wafers and softbaked via a vacuum hotplate at 90° C. for 60 seconds. The resist coating layer is exposed through a photomask at 248 nm, and then the exposed coating layers are post-exposure baked at 110° C. The coated wafers are then treated with 0.26N aqueous tetramethylammonium hydroxide solution to develop the imaged resist layer and provide a relief image.

Example 6

Resist Preparation and Imagingi

A resist formulation comprising 6.87 g of poly(4-hydroxystyrene) substituted with 32% tert-butoxycarbonyloxy groups (25 wt. % solution in propylene glycol monomethyl ether acetate (PMA)), 13.61 g of poly(4hydroxystyrene) substituted with 40% ethoxyethoxy groups (30 wt. % solution in PMA), 0.25 g of tosyl-triflic diazo photoacid generator, 3.21 g of tetrabutyl ammonium hydroxide (1 wt. % in PMA), 0.78 g of FC0-430 (1 wt. % solution in PMA) and 15.15 g PMA was prepared. The resulting solution was filtered through a 0.20 μm membrane filter, spun coated onto 600 angstrom organic antireflective layer coated silicon wafers on a TEL Mark 8 system and baked at 90° C. for 90 seconds to f0orm a resist film having a thickness of 5000 angstroms +/−25 angstroms. The resulting wafers were exposed on an ASML/3300 0.63 NA stepepr under annular illumination conditions. The wafers were post-exposure baked at 100° C. for 90 seconds then developed in aqueous alkaline developer using a 45 second single puddle process (aqueous pre-rinse step prior to develop). The results of the evaluation indicated that 150 nm 1:1 dense line features were resolved.

The foregoing description of the invention is merely illustrative thereof, and it is understood that variations and modifications can be effected without departing from the spirit or scope of the invention as set forth in the following claims.

What is claimed is:

1. A photoresist composition comprising:
   1) a resin that is at least substantially free of aromatic groups; and
   2) a photoacid generator compound in an amount sufficient to permit development of an exposed coating layer of the composition, the photoacid generator compound being of the following Formula I:

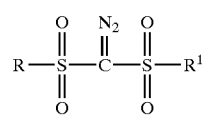

I wherein R and R$^1$ are different and are optionally substituted alkyl; optionally substituted alkoxy; optionally substituted alkylthio; optionally substituted carbocyclic aryl; optionally substituted aralkyl; optionally substituted heteroaryl; optionally substituted heteroalicyclic; phenyl having one more phenyl-ring electron-withdrawing substituents; an optionally substituted alicyclic group; optionally substituted naphthyl; optionally substituted thienyl;

optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl;

wherein at least one of R and $R^1$ is phenyl having one more phenyl-ring electron-withdrawing substituents; an optionally substituted alicyclic group; optionally substituted naphthyl; optionally substituted thienyl; optionally substituted coumarinyl; optionally substituted quinolinyl; optionally substituted furyl; optionally substituted thiazolyl; optionally substituted oxazolyl; optionally substituted benzofuranyl; optionally substituted benzothiazolyl; or optionally substituted tetrahydrofuranyl.

2. The photoresist composition of claim 1 wherein the resin comprises photo-acid labile groups.

3. The photoresist of claim 1 wherein the resin comprises photoacid-labile acetal or ketal groups.

4. The photoresist of claim 1 wherein the resin is completely free of aromatic groups.

5. The photoresist of claim 1 wherein the resin comprises polymerized optionally substituted norbornene groups.

6. The photoresist composition of claim 1 wherein at least one of R or $R^1$ is alicyclic.

7. The photoresist composition of claim 1 wherein at least one of R or $R^1$ is adamantyl.

8. The photoresist composition of claim 1 wherein at least one of R or $R^1$ is ortho-trifluoromethylphenyl.

9. The photoresist composition of claim 1 wherein the composition consists essentially of i) the resin, ii) the photoacid generator, and iii) an added base.

10. A photoresist composition comprising:
a resin and an α,α-methylenedisulfone photoacid generator compound in an amount sufficient to permit development of an exposed coating layer of the composition.

11. The photoresist composition of claim 10 wherein the photoacid generator compound has a methylene group interposed between two sulfone groups, and the methylene is substituted by at least one group other than hydrogen.

12. The photoresist composition of claim 11 wherein the photoacid generator compound is of the following Formula II:

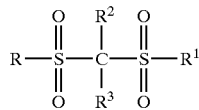

wherein R and $R^1$ are the same or different non-hydrogen substituents;;

$R^2$ and $R^3$ are the same or different and may be hydrogen or a non-hydrogen substituent.

13. The photoresist composition of claim 11 wherein the photoacid generator compound wherein the photoacid generator compound is of the following formula:

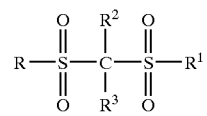

wherein R and $R^1$ are independently selected from the group consisting of optionally substituted alkyl; optionally substituted alkoxy; optionally substituted alkylthio; optionally substituted alkylsulfinyl; optionally substituted alkylsulfonyl; optionally substituted carbocyclic aryl; optionally substituted aralkyl; optionally substituted heteroaryl; optionally substituted heteroalicyclic; or an optionally substituted alicyclic group;

$R^2$ and $R^3$ are independently hydrogen, optionally substituted alkyl; optionally substituted alkoxy; optionally substituted alkylthio; optionally substituted alkylsulfinyl; optionally substituted alkylsulfonyl; optionally substituted carbocyclic aryl; optionally substituted aralkyl optionally substituted heteroaryl; optionally substituted heteroalicyclic; or an optionally substituted alicyclic group.

14. The photoresist composition of claim 12 wherein at least one of $R^2$ and $R^3$ is other than hydrogen.

15. A photoresist composition comprising:
a resin and a disulfonehydrazine photoacid generator compound in an amount sufficient to permit development of an exposed coating layer of the composition.

16. The photoresist composition of claim 15 wherein the photoacid generator compound is of the following Formula III:

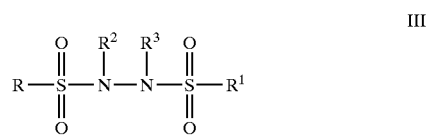

wherein R and $R^1$ are the same or different and are other than hydrogen;

$R^2$ and $R^3$ are the same or different and may be hydrogen or a non-hydrogen substituent.

17. The photoresist composition of claim 15 wherein the photoacid generator compound is of the following formula:

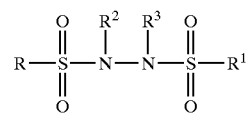

wherein R and $R^1$ are independently optionally substituted alkyl; optionally substituted alkoxy; optionally substituted alkylthio; optionally substituted alkylsulfinyl; optionally substituted alkylsulfonyl; optionally substituted carbocyclic aryl; optionally substituted aralkyl; optionally substituted heteroaryl; optionally substituted heteroalicyclic; or an optionally substituted alicyclic group;

$R^2$ and $R^3$ are independently hydrogen; optionally substituted alkyl; optionally substituted alkoxy; optionally substituted alkylthio; optionally substituted alkylsulfinyl; optionally substituted alkylsulfonyl; optionally substituted carbocyclic aryl; optionally substituted aralkyl; optionally substituted heteroaryl; optionally substituted heteroalicyclic; or an optionally substituted alicyclic group.

18. The photoresist composition of claim 15 wherein at least one of $R^2$ and $R^3$ is hydrogen.

19. An article of manufacture having on at least one surface a coating layer of the photoresist composition of claim 1.

20. The photoresist composition of claim 1 wherein the resin comprises polymerized alkyl acrylate units.

21. The photoresist composition of claim 10 wherein the resin is at least substantially free of aromatic units.

22. The photoresist composition of claim 15 wherein the resin is at least substantially free of aromatic units.

* * * * *